United States Patent
Avramescu et al.

(10) Patent No.: US 9,673,590 B2
(45) Date of Patent: Jun. 6, 2017

(54) SEMICONDUCTOR STRIPE LASER

(71) Applicant: OSRAM Opto Semiconductors GmbH, Regensburg (DE)

(72) Inventors: Adrian Stefan Avramescu, Regensburg (DE); Clemens Vierheilig, Tegernheim (DE); Christoph Eichler, Tegernheim (DE); Alfred Lell, Maxhuette-Haidhof (DE); Jens Mueller, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 136 days.

(21) Appl. No.: 14/704,532

(22) Filed: May 5, 2015

(65) Prior Publication Data

US 2016/0211646 A1  Jul. 21, 2016

Related U.S. Application Data

(63) Continuation of application No. 14/092,681, filed on Nov. 27, 2013, now Pat. No. 9,054,487.

(30) Foreign Application Priority Data

Nov. 28, 2012 (DE) ........................ 10 2012 111 512

(51) Int. Cl.
  *H01S 5/00* (2006.01)
  *H01S 5/042* (2006.01)
  (Continued)

(52) U.S. Cl.
  CPC ........ *H01S 5/0425* (2013.01); *H01S 5/02461* (2013.01); *H01S 5/22* (2013.01);
  (Continued)

(58) Field of Classification Search
  CPC .......... H01S 5/22; H01S 5/0425; H01S 5/028; H01S 2301/176; H01S 5/0282;
  (Continued)

(56) References Cited

U.S. PATENT DOCUMENTS 5,070,510 A * 12/1991 Konushi ............ H01L 33/0062
  257/E21.123
6,430,203 B1 * 8/2002 Yokouchi .................. H01S 5/20
  372/45.01

(Continued)

FOREIGN PATENT DOCUMENTS

DE  19963807 A1  7/2001
DE  10147791 A1  4/2003

(Continued)

OTHER PUBLICATIONS

Lin, et al., "Thermal conduction in AlxGa1—xN alloys and thin films," Journal of Applied Physics, vol. 97, Mar. 25, 2005, pp. 073710-1-073710-6.

*Primary Examiner* — Jessica Manno
*Assistant Examiner* — Delma R Forde
(74) *Attorney, Agent, or Firm* — Slater Matsil, LLP

(57) ABSTRACT

A semiconductor stripe laser has a first semiconductor region having a first conductivity type and a second semiconductor region having a different, second conductivity type. An active zone for generating laser radiation is located between the semiconductor regions. A stripe waveguide is formed in the second semiconductor region and is arranged to guide waves in a one-dimensional manner and is arranged for a current density of at least 0.5 kA/cm$^2$. A second electrical contact is located on the second semiconductor region and on an electrical contact structure for external electrical contacting. An electrical passivation layer is provided in certain places on the stripe waveguide. A thermal insulation apparatus is located between the second electrical contact and the active zone and/or on the stripe waveguide.

13 Claims, 7 Drawing Sheets

(51) Int. Cl.
*H01S 5/024* (2006.01)
*H01S 5/22* (2006.01)
*H01S 5/022* (2006.01)
*H01S 5/323* (2006.01)

(52) U.S. Cl.
CPC ................ *H01L 2224/4847* (2013.01); *H01L 2224/73265* (2013.01); *H01L 2924/12032* (2013.01); *H01S 5/02276* (2013.01); *H01S 5/32341* (2013.01); *H01S 2301/176* (2013.01)

(58) Field of Classification Search
CPC ............. H01S 5/02461; H01S 5/02469; H01S 5/0281; H01S 5/026; H01S 5/2216; H01S 5/1014; H01S 5/02276; H01S 5/32341; H01L 2224/4847; H01L 2224/73265; H01L 2924/12032
USPC ...................................... 372/34, 43.01–50.23
See application file for complete search history.

(56) References Cited

U.S. PATENT DOCUMENTS

| | | | | |
|---|---|---|---|---|
| 7,305,017 | B2 * | 12/2007 | Hashimoto | ............ B82Y 20/00 372/45.011 |
| 8,222,658 | B2 | 7/2012 | Shinagawa et al. | |
| 2002/0064199 | A1 * | 5/2002 | Takei | ................. B82Y 20/00 372/46.012 |
| 2002/0110169 | A1 * | 8/2002 | Iwai | .................... H01S 5/18352 372/50.11 |
| 2003/0116767 | A1 | 6/2003 | Kneissl et al. | |
| 2003/0128729 | A1 * | 7/2003 | Matsumura | ............... H01S 5/22 372/46.01 |
| 2003/0231684 | A1 | 12/2003 | Yagi et al. | |
| 2004/0101986 | A1 * | 5/2004 | Kozaki | ................. B82Y 20/00 438/22 |
| 2005/0030995 | A1 * | 2/2005 | Kawakami | ................ H01S 5/10 372/43.01 |
| 2006/0078022 | A1 | 4/2006 | Kozaki et al. | |
| 2006/0251137 | A1 | 11/2006 | Sung et al. | |
| 2007/0086497 | A1 * | 4/2007 | Tanaka | ................ H01S 5/02461 372/43.01 |
| 2007/0290230 | A1 * | 12/2007 | Kawaguchi | ............ B82Y 20/00 257/196 |
| 2008/0049801 | A1 | 2/2008 | Eichler et al. | |
| 2008/0049804 | A1 * | 2/2008 | Hashimoto | ............ B82Y 20/00 372/45.013 |
| 2008/0291961 | A1 | 11/2008 | Kamikawa et al. | |
| 2009/0141764 | A1 * | 6/2009 | Yagi | ...................... H01S 5/2231 372/45.01 |
| 2009/0161711 | A1 | 6/2009 | Kubota | |
| 2009/0219966 | A1 * | 9/2009 | Tan | ........................ B82Y 20/00 372/43.01 |
| 2010/0322276 | A1 | 12/2010 | Yoshizumi et al. | |
| 2012/0189029 | A1 | 7/2012 | Kashiwagi et al. | |
| 2012/0327967 | A1 | 12/2012 | Enya et al. | |
| 2013/0183778 | A1 * | 7/2013 | Katsuyama | ............ H01S 5/026 438/27 |
| 2013/0183784 | A1 * | 7/2013 | Katsuyama | ............. H01S 5/026 438/47 |
| 2014/0036948 | A1 * | 2/2014 | Hayakawa | ............. H01S 5/343 372/45.01 |
| 2015/0207298 | A1 * | 7/2015 | Tsuji | .................... H01S 5/2275 438/39 |

FOREIGN PATENT DOCUMENTS

| | | |
|---|---|---|
| DE | 102006046297 A1 | 4/2008 |
| DE | 102009015314 A1 | 9/2010 |
| DE | 102009056386 A1 | 6/2011 |
| DE | 102009058796 A1 | 6/2011 |
| DE | 102011100175 A1 | 11/2012 |
| JP | 2005203804 A | 7/2005 |

\* cited by examiner

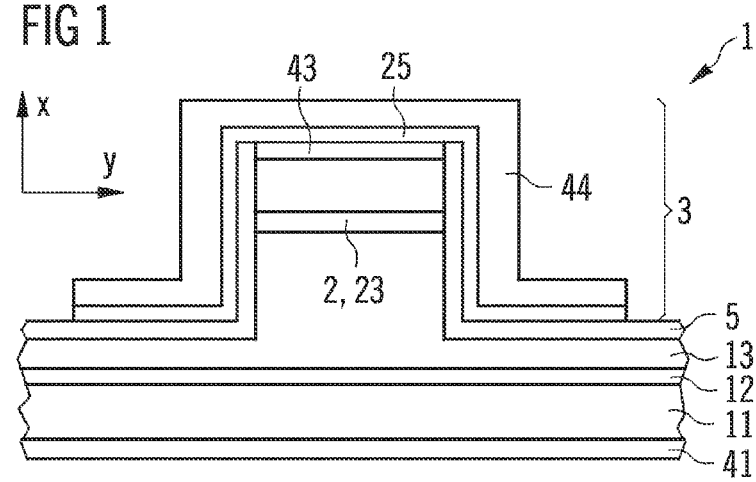
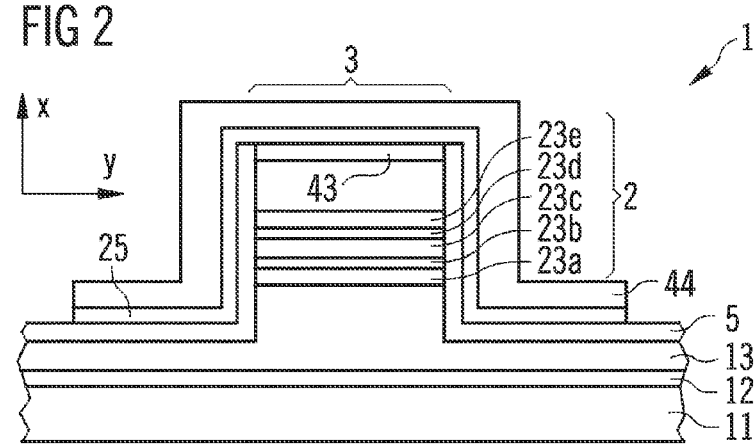
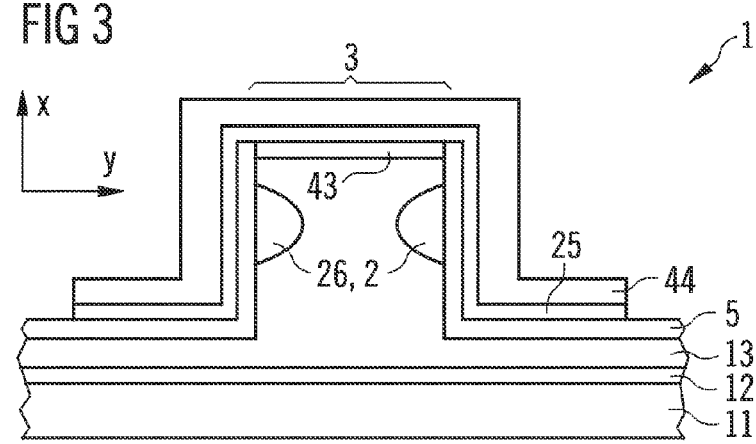

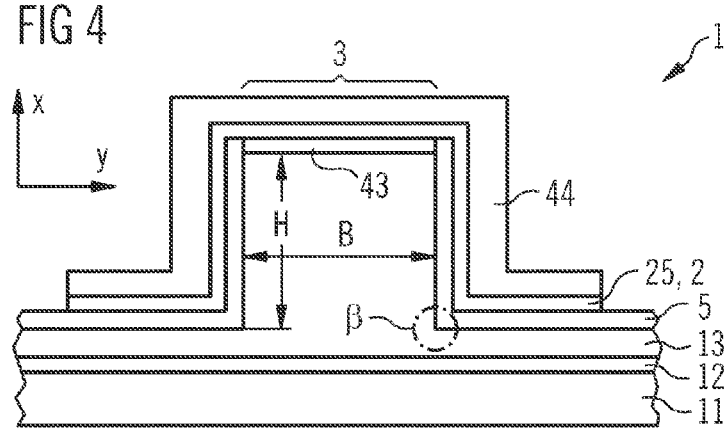
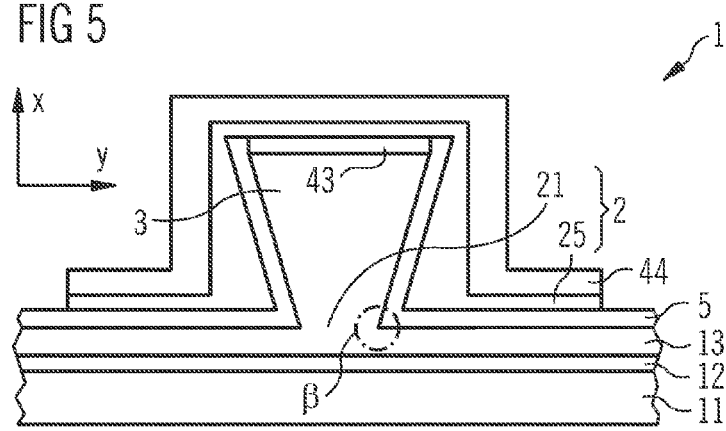
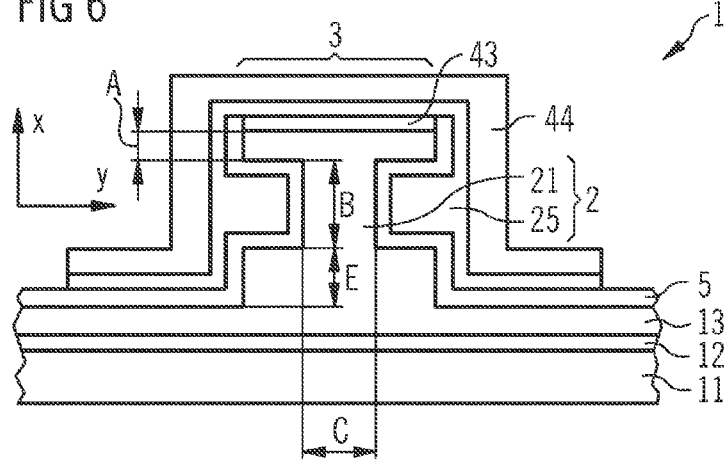

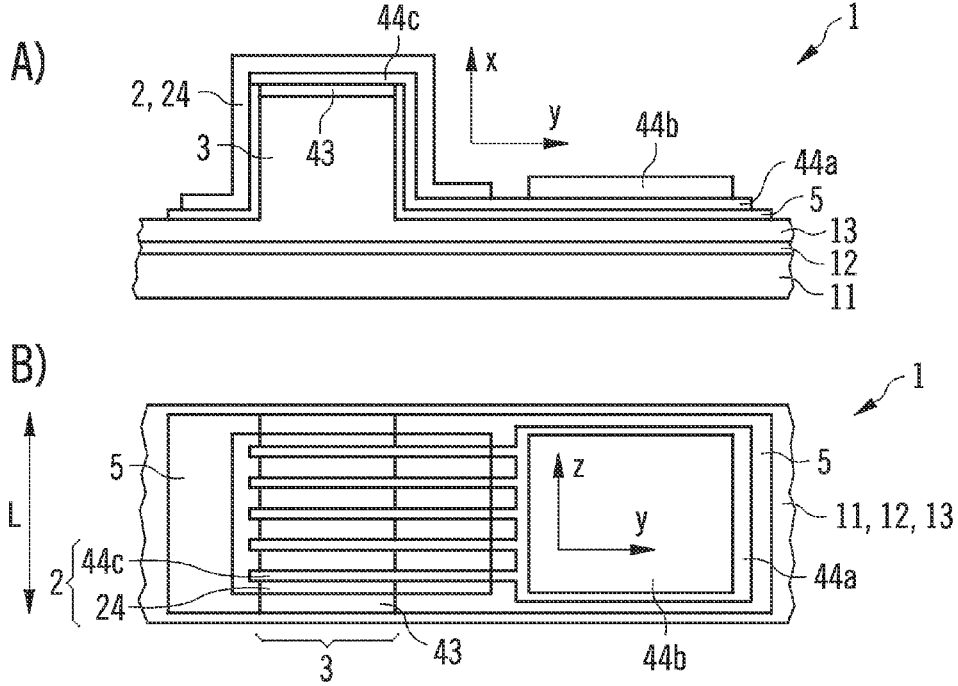
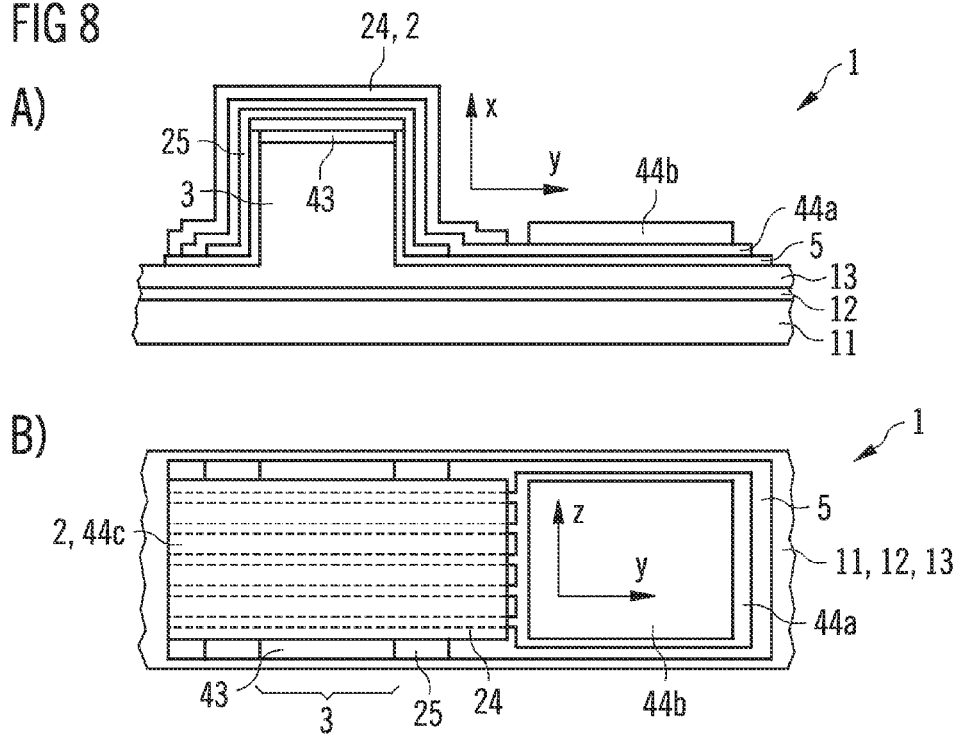

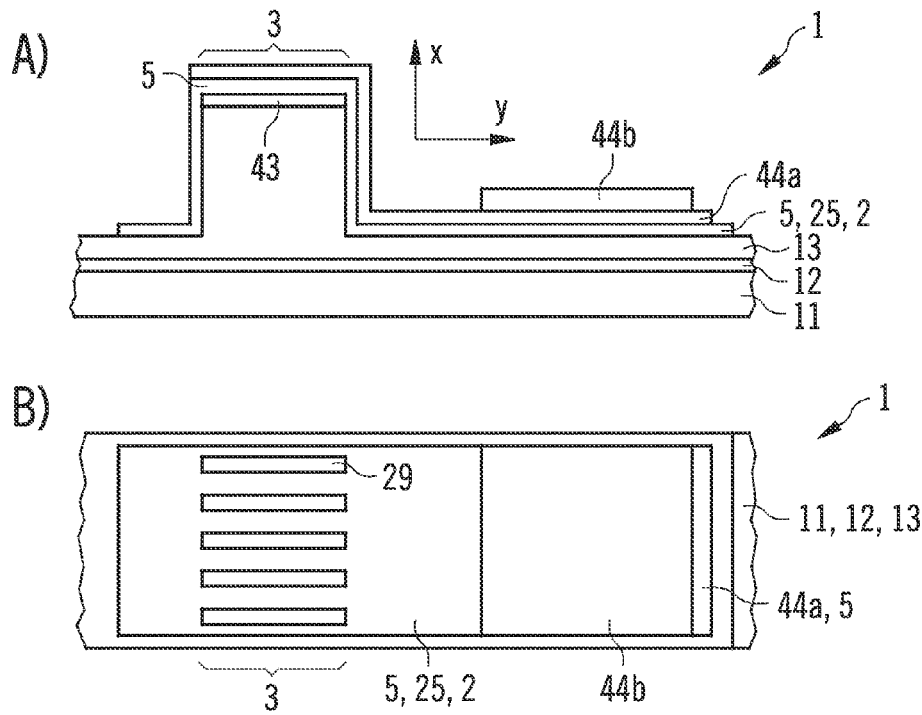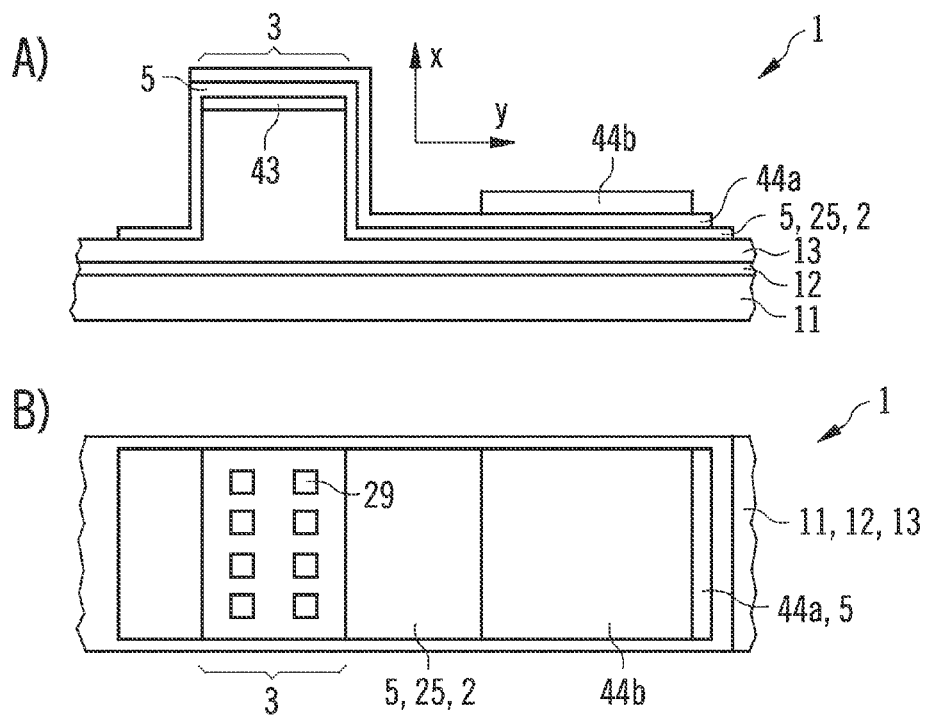

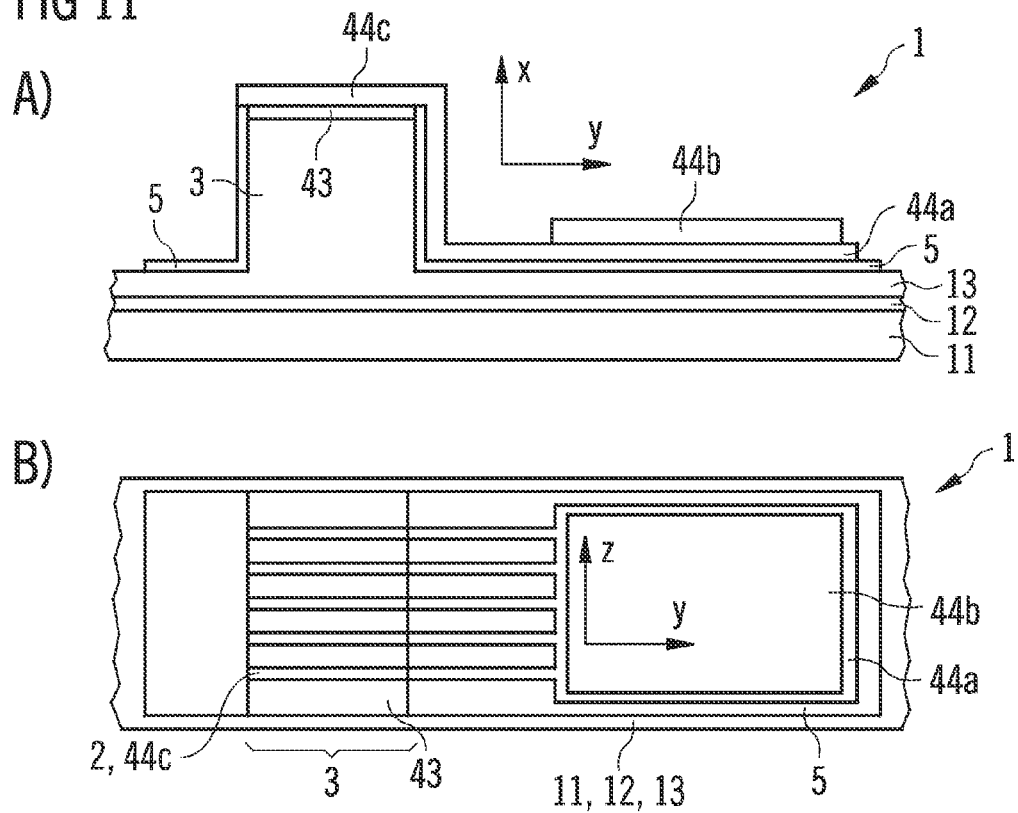
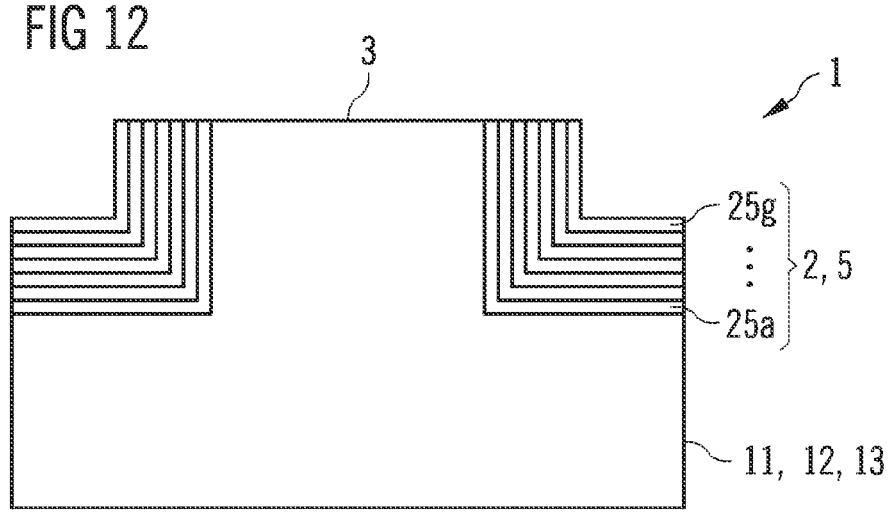

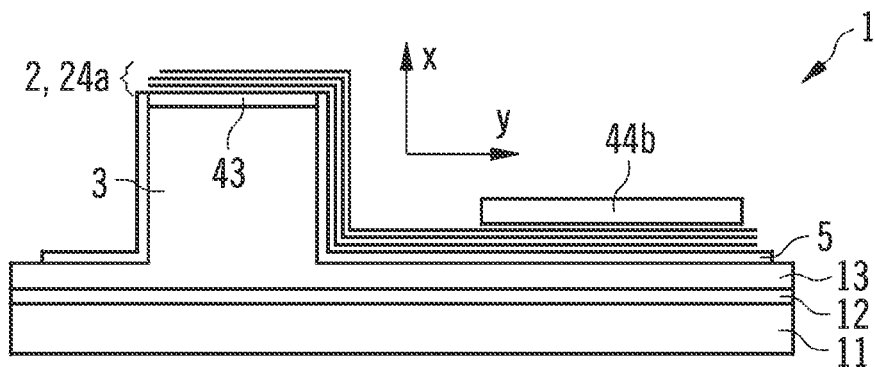
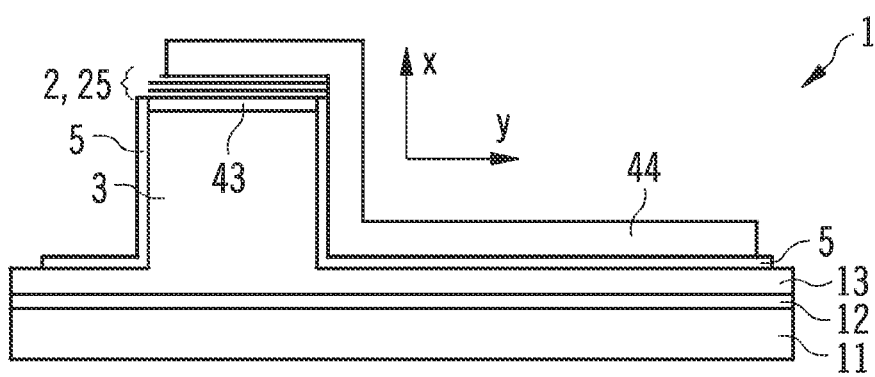
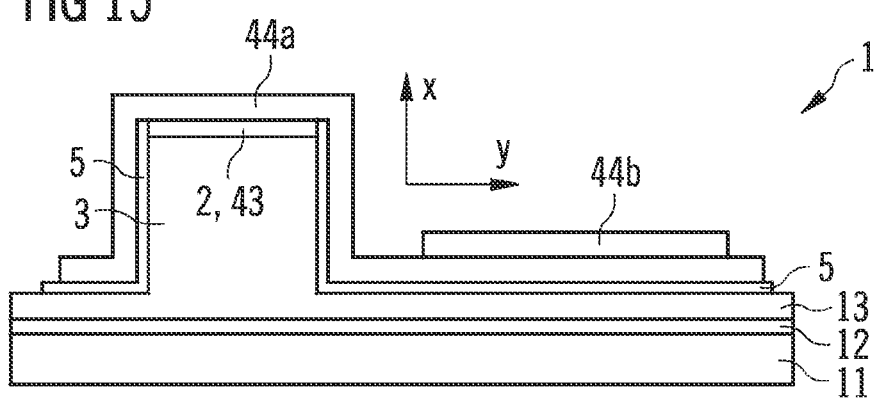

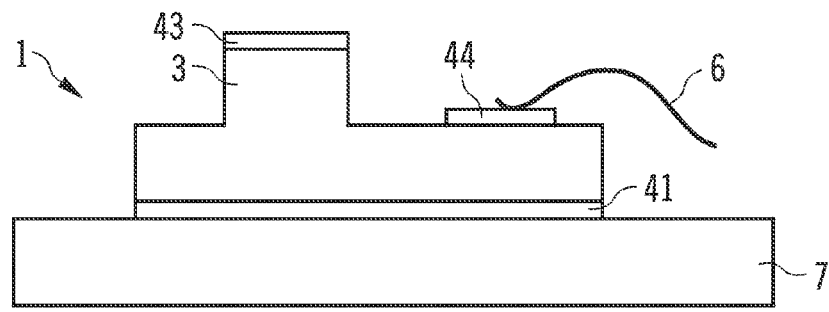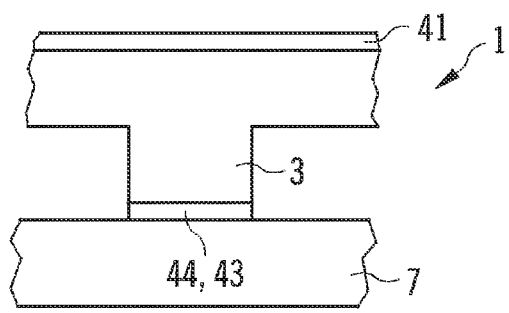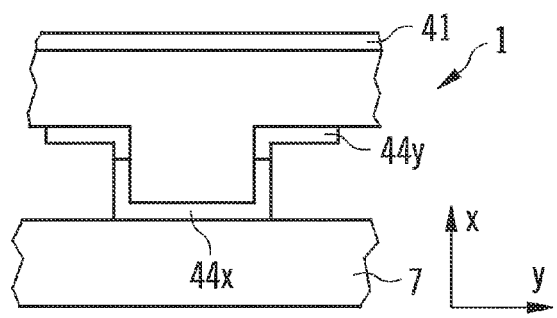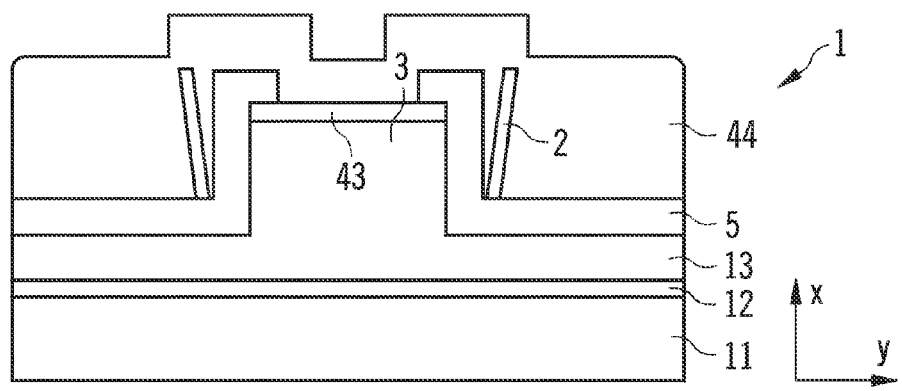

SEMICONDUCTOR STRIPE LASER

This is a continuation application of U.S. application Ser. No. 14/092,681, entitled "Semiconductor Stripe Laser," which was filed on Nov. 27, 2013 and claims priority to German Patent Application No. 10 2012 111 512.5 filed on Nov. 28, 2012. All applications are incorporated herein by reference.

TECHNICAL FIELD

A semiconductor stripe laser is provided.

SUMMARY

Embodiments of the invention provide a semiconductor stripe laser which has a reduced voltage drop on an electrical contact surface.

In accordance with at least one embodiment, the semiconductor stripe laser emits laser radiation when used in the normal manner. The semiconductor stripe laser can be a pulsed laser or a continuous wave laser.

In accordance with at least one embodiment, the semiconductor stripe laser is based upon a semiconductor material, preferably upon a III-V-compound semiconductor material. The semiconductor material is, e.g., nitride-compound semiconductor material such as $Al_nIn_{1-n-m}Ga_mN$ or a phosphide-compound semiconductor material such as $Al_nIn_{1-n-m}Ga_mP$ or even an arsenide-compound semiconductor material such as $Al_nIn_{1-n-m}Ga_mAs$, where $0 \leq n \leq 1$, $0 \leq m \leq 1$ and $n+m \leq 1$ in each case. The semiconductor layer sequence can thereby have dopants and additional constituents. However, for the sake of simplicity only the essential constituents of the crystal lattice of the semiconductor layer sequence, i.e., Al, As, Ga, In, N or P, are stated, even if they can be replaced and/or supplemented in part by small amounts of further substances.

In accordance with at least one embodiment, the semiconductor stripe laser has a first semiconductor region. The first semiconductor region has a first conductivity type. In particular, the first semiconductor region is n-type. The first semiconductor region can have a single semiconductor layer or a plurality of semiconductor layers, for instance a cladding layer, a waveguide layer and/or electrical contact layers.

In accordance with at least one embodiment, the semiconductor stripe laser comprises a second semiconductor region. The second semiconductor region has a second conductivity type which is different from the first conductivity type. For example, the second semiconductor region is p-type. The second semiconductor region can also be formed from one or a plurality of semiconductor layers and can have a cladding layer, a waveguide layer and/or a contact layer.

In accordance with at least one embodiment, an active zone is located in certain places or on the entire surface between the first and second semiconductor regions. The active zone is arranged for generating the laser radiation. The active zone has at least one pn-transition or at least one quantum well structure.

In accordance with at least one embodiment, the first semiconductor region, the active zone and the second semiconductor region directly follow one another along a growth direction of the semiconductor material. In a preferred manner, the semiconductor material is epitaxially deposited. In a preferred manner, the active zone and the semiconductor regions then do not penetrate one another but rather adjoin one another in particular in a planar and smooth manner.

In accordance with at least one embodiment, the semiconductor stripe laser has a stripe waveguide. In a preferred manner, the stripe waveguide is formed exclusively in the material of the second semiconductor region. The stripe waveguide is then free from the active zone. Alternatively, the stripe waveguide can comprise the active zone and include materials of both semiconductor regions. For example, the stripe waveguide is formed by material being removed in the second semiconductor region, so that the stripe waveguide is a raised portion above remaining regions of the semiconductor stripe laser.

In accordance with at least one embodiment, the stripe waveguide is arranged to guide waves of the laser radiation generated during operation, in particular to guide waves thereof in a one-dimensional manner. In other words, a refractive index progression is adjusted by the stripe waveguide such that a laser mode is conducted in a specific region. During normal use, the semiconductor stripe laser can be a monomode laser or even a multimode laser.

In accordance with at least one embodiment, during normal use a current density in the stripe waveguide is at least 0.5 $kA/cm^2$ or at least 1.0 $kA/cm^2$ or at least 1.5 $kA/cm^2$. The current density can be a current density which is averaged over the entire stripe waveguide. In a preferred manner, a main current direction in the stripe waveguide is oriented perpendicularly to the active zone.

In accordance with at least one embodiment, the semiconductor stripe laser has a first electrical contact on the first semiconductor region. The first electrical contact can be provided over the entire surface of, or at certain points on, the first semiconductor region. For example, the first electrical contact is formed from a metal or a metal alloy. It is possible for the semiconductor stripe laser to be attached to an external support via the first electrical contact, for instance by soldering.

In accordance with at least one embodiment, a second electrical contact is located on the second semiconductor region. In particular, the second electrical contact is restricted to a boundary surface, facing away from the active zone, of the stripe waveguide. The second electrical contact is formed, e.g., from a metal, a metal alloy or a non-metallic, electrically conductive material.

In accordance with at least one embodiment, the second electrical contact is located on an electrical contact structure. The electrical contact structure is arranged for external electrical contacting of the semiconductor component. For example, the electrical contact structure comprises conductor tracks and electrical contact surfaces such as solder pads or bond pads.

In accordance with at least one embodiment, an electrical passivation layer is provided in certain places on the stripe waveguide. In particular, the electrical passivation layer covers flanks of the stripe waveguide which can be partially or completely oriented in a perpendicular manner to the active zone. Preferably, during normal use, no current flows through the electrical passivation layer.

In accordance with at least one embodiment, a thermal insulation apparatus is located between the second electrical contact and the active zone. The thermal insulation layer can be located partially or completely inside the stripe waveguide. Alternatively or in addition, the thermal insulation apparatus is attached externally to the stripe waveguide. The thermal insulation apparatus serves to reduce a discharge of thermal energy out of the stripe waveguide and/or away from the second electrical contact. The thermal insulation apparatus serves to increase a thermal resistance in the direction away from the stripe waveguide and/or from the second electrical contact. During normal use of the semiconductor stripe laser, the thermal insulation apparatus causes a temperature on the second electrical contact to be increased in comparison with a semiconductor stripe laser without a thermal insulation apparatus.

According to at least one embodiment, the semiconductor stripe laser has a first semiconductor region with a first conductivity type and a second semiconductor region with a different, second conductivity type. Disposed between the first and the second semiconductor region is an active zone for generating a laser radiation. A stripe waveguide is formed in the second semiconductor region and is arranged to guide waves in a one dimensional manner and is arranged for a current density of at least 0.5 kA/cm$^2$. A first electrical contact is provided on the first semiconductor region. A second electrical contact is located on the second semiconductor region and on an electrical contact structure for external electrical contacting of the semiconductor stripe laser. An electrical passivation layer is provided at certain places on the stripe waveguide. A thermal insulation apparatus is located between the second electrical contact and the active zone and/or on the stripe waveguide.

In particular, in the case of nitride-based semiconductor stripe lasers, there is a comparatively high voltage drop on an electrical contact. This voltage drop results in particular from Schottky barriers at a metal-semiconductor transition and from a comparatively small electrical conductivity of p-type gallium nitride through a low hole density by reason of the low-lying acceptor states of in particular magnesium in GaN. In the case of such low-lying acceptor states, only a comparatively small proportion of the acceptors are thermally activated. By increasing the temperature on the electrical contact, it is possible to achieve a higher proportion of thermally activated acceptors and it is hereby possible to reduce the voltage drop. Increased efficiency and increased service life can be associated with this.

In accordance with at least one embodiment, the thermal insulation apparatus comprises one or a plurality of semiconductor layers of the second semiconductor region or consists of at least one such semiconductor layer. At room temperature, an average thermal conductivity of this at least one semiconductor layer preferably amounts at the most to 60 W/mK or at the most to 40 W/mK. In particular, the at least one semiconductor layer has a thermal conductivity which amounts at the most to 80% or 50% or 20% or 10% or 5% of the average thermal conductivity of the remaining layers of the second semiconductor region.

In accordance with at least one embodiment, the at least one semiconductor layer of the thermal insulation apparatus is formed from $Al_{1-n-m}In_mGa_{1-n-m}N$. The parameter n amounts in this case preferably to at least 0.05 or 0.1 or 0.2. Alternatively or in addition, n<0.9 or <0.8 or <0.6. Preferably, the parameter m is >0 and in particular is at least 0.0001 or 0.001 or 0.01 and/or at the most 0.2 or 0.1. The value 1-n-m amounts e.g. to at least 0.01 or 0.02 and/or at the most to 0.1 or 0.05. The sum of n and m is ≤1 or preferably <1, in particular <0.9 or and/or >0.5 or >0.8 or >0.85.

In accordance with at least one embodiment, the thickness of the thermal insulation apparatus is at least 1 nm or 10 nm or 20 nm and/or at the most 500 nm or 1000 nm or 2000 nm or at the most 10 µm. If the insulation apparatus has a plurality of the semiconductor layers, then an average layer thickness of these individual semiconductor layers is preferably at least 0.1 nm or 0.5 nm or 1 nm and/or at the most 100 nm or 20 nm or 10 nm.

In accordance with at least one embodiment, a spacing between the insulation apparatus and the second electrical contact is at least 100 nm or 200 nm. Alternatively or in addition, this spacing is at the most 1000 nm or 750 nm or 500 nm.

In accordance with at least one embodiment, a spacing between the thermal insulation apparatus and the active zone amounts at least to 200 nm or 400 nm or 500 nm. Alternatively or in addition, this spacing is at the most 1.5 µm or 1000 nm or 750 nm.

In accordance with at least one embodiment, the at least one semiconductor layer of the thermal insulation apparatus completely spans the stripe waveguide. In other words, the semiconductor layer is a continuous layer which is present in the entire stripe waveguide and is oriented preferably in parallel with the active zone. The at least one semiconductor layer is then present not only in a sub-region of the stripe waveguide.

In accordance with at least one embodiment, a layer of the second semiconductor region which is closest to the second electrical contact and can contact the second electrical contact is a layer consisting of p-doped GaN. This layer can be free or substantially free of aluminum and indium. A dopant concentration of this layer is preferably at least $10^{19}$/cm$^3$ or $5\times10^{19}$/cm$^3$ and/or at the most $5\times10^{20}$/cm$^3$ or $2\times10^{20}$/cm$^3$. A dopant is in particular magnesium. In different regions of the second semiconductor region from this, a dopant concentration is, e.g., at least $10^{18}$/cm$^3$ or $5\times10^{18}$/cm$^3$ or $10^{19}$/cm$^3$ and/or at the most $5\times10^{19}$/cm$^3$. Thermal conductivity can be reduced by means of such a comparatively high dopant concentration.

In accordance with at least one embodiment, the plurality of semiconductor layers of the insulation apparatus form a multilayered phonon barrier. In other words, the semiconductor layers are arranged to have an increased resistance for lattice oscillations.

In accordance with at least one embodiment, the insulation apparatus has a narrowed portion in the stripe waveguide or the insulation apparatus consists of such a narrowed portion. The narrowed portion is located preferably between the active zone and the second electrical contact. The narrowed portion is formed by the removal of material from the stripe waveguide.

In accordance with at least one embodiment, the narrowed portion extends partially or completely along the stripe waveguide, along a main propagation direction of laser radiation in the stripe waveguide. In particular, within the scope of production tolerances the narrowed portion is formed symmetrically with respect to a plane perpendicular to the active zone and in parallel with the main propagation direction.

In accordance with at least one embodiment, as seen in cross-section the stripe waveguide is formed in a trapezoidal manner, wherein a width of the stripe waveguide is reduced in the direction towards the active zone. Alternatively, it is possible that as seen in cross-section the stripe waveguide is formed in a T-shaped manner.

In accordance with at least one embodiment, the thermal insulation apparatus is produced at least partially by virtue of the fact that the electrical contact structure on the stripe waveguide is structured to form a plurality of fingers. In combination, a total width of the fingers can be less than a width of the electrical contact structure which is not yet formed into fingers, as seen in plan view.

In accordance with at least one embodiment, the electrical contact structure covers at the most 60% or 40% or 20% of the second electrical contact, as seen in plan view. It is possible that the second electrical contact is for the most part not covered by the electrical contact structure.

In accordance with at least one embodiment, the thermal insulation apparatus comprises, or consists of, a thermal insulation layer. The thermal insulation layer covers the electrical contact structure or the fingers of the electrical contact structure completely or partially.

In accordance with at least one embodiment, the thermal insulation apparatus comprises, or consists of, a further thermal insulation layer. The further thermal insulation layer is located directly on the second semiconductor region of the stripe waveguide and/or directly on the passivation layer on the stripe waveguide.

In accordance with at least one embodiment, the further thermal insulation layer is located in certain places between the electrical contact structure and the second electrical contact. In this case, preferably one or a plurality of openings is/are formed in the further thermal insulation layer. In the at least one opening, the contact structure is directly connected to the second contact.

In accordance with at least one embodiment, as seen in plan view the openings make up a surface proportion of the stripe waveguide of at the most 55% or 35% or 25% or 15%. In other words, a total area of the openings can be comparatively small relative to the total area of the stripe waveguide.

In accordance with at least one embodiment, the thermal insulation layer and/or the further thermal insulation layer is/are formed by means of a layer stack having a plurality of layers. A material of the insulating layers is preferably different from a material of the stripe waveguide, the passivation layer, the second electrical contact and/or the electrical contact structure. For example, the layers of the layer stack are each formed from an oxide or nitride. For example, the layer stack has layers consisting of two different materials which follow one another alternately. The layer stack preferably comprises at least four or eight or twelve layers and/or at the most 100 or 50 or 25 layers.

In accordance with at least one embodiment, the insulation apparatus is produced partly or completely by virtue of the fact that the electrical contact structure is formed partly or completely by means of a layer stack. The layer stack comprises, e.g., at least three or five or eight layers and/or at the most 25 or 20 or 15 layers. It is possible that at least one layer of the layer stack is formed from an electrically conductive oxide or nitride. If the layer stack alternately has metallic layers and layers consisting of an electrically conductive oxide or nitride, then a thickness of the metallic layers is preferably less than a thickness of the layers of the oxide or nitride.

In accordance with at least one embodiment, the thermal insulation apparatus is produced partly or completely by virtue of the fact that the second electrical contact comprises one or a plurality of layers which are formed from an electrically conductive oxide or nitride. It is possible that the second electrical contact consists of at least one such layer.

In accordance with at least one embodiment, the thermal insulation apparatus is produced partly or completely by virtue of the fact that the thermal conductivity of a material is reduced in at least one sub-area of the second semiconductor region in the stripe waveguide by means of ion implantation and/or partial destruction of a crystal structure, e.g., to at the most 50% or 30% of a value of the thermal conductivity prior to the corresponding treatment. The sub-area is located preferably completely within the stripe waveguide and between the second electrical contact and the active zone. It is possible that this sub-area is restricted to a material of the second semiconductor region. In the sub-area, an electrical conductivity can also be reduced or can be negligible.

In accordance with at least one embodiment, this sub-area is spaced apart from the second contact and has a smaller width than the stripe waveguide. In particular, two sub-areas are present which extend in parallel with the main propagation direction on flanks of the stripe waveguide. As seen in cross-section, the sub-area can be formed in a similar manner to a half cylinder.

BRIEF DESCRIPTION OF THE DRAWINGS

A semiconductor stripe laser described in this case will be explained in more detail hereinafter with reference to the drawing and with the aid of exemplified embodiments. Like elements are indicated by like reference numerals in the individual figures. The elements illustrated in the figures and their size relationships among one another should not be regarded as true to scale. Rather, individual elements may be represented with an exaggerated size for the sake of better representability and/or for the sake of better understanding.

FIGS. 1 to 15 and 19 show schematic sectional views or schematic sectional views together with schematic plan views of exemplified embodiments of semiconductor stripe lasers described in this case; and FIGS. 16 to 18 show schematic sectional views of arrangements comprising semiconductor stripe lasers described in this case.

DETAILED DESCRIPTION OF ILLUSTRATIVE EMBODIMENTS

FIG. 1 illustrates an exemplified embodiment of a semiconductor stripe laser 1. The semiconductor stripe laser 1 has a first semiconductor region 11 and a second semiconductor region 13. Located between the semiconductor regions 11, 13 is an active zone 12 for generating laser radiation. A stripe waveguide 3 is formed in the second semiconductor region 13 which in particular is of a p-type. As seen in cross-section, the stripe waveguide 3 is configured in a rectangular manner, an approximately rectangular manner or, in contrast to the illustration, in a trapezoidal manner. The stripe waveguide 3 extends along a z-direction perpendicular to the plane of the drawing, see also FIG. 7B.

An electrical passivation layer 5 is provided on flanks of the stripe waveguide 3. The passivation layer 5 can also extend on boundary surfaces of the second semiconductor region 13 which are oriented in parallel with the active zone 12.

Located on a side of the first semiconductor region 11 facing away from the active zone 12 is a first electrical contact 41 which, unlike the illustration, can also be provided only in certain regions on the first semiconductor region 11. Located on a side of the stripe waveguide 3 facing away from the active zone 12 is a second electrical contact 43 which is arranged to impress current into the second semiconductor region 13. The second electrical contact 43 is formed preferably by a metal or a metal alloy. The second electrical contact 43 can be formed by a plurality of metallic layers.

Located on a side, facing away from the active zone 12, of the passivation layer 5 or of the optional insulation layer 25 is an electrical contact structure 44, only part of which is illustrated in FIG. 1. The semiconductor stripe laser 1 can be electrically externally contacted via the contact structure 44.

Furthermore, the semiconductor stripe laser 1 comprises a thermal insulation apparatus 2. The thermal insulation apparatus 2 is formed by means of a semiconductor layer 23 in the second semiconductor region 13. The semiconductor layer 23 is oriented in parallel with the active zone 12 and is spaced apart from the active zone 12 and the second electrical contact 43. The semiconductor layer 23 is formed from AlInGaN with a indium proportion of preferably at least 0.1% or 26% and/or at the most 20% or 3% and with an aluminum proportion of preferably at least 5% or 10% or 20%. This type of semiconductor layer 23 serves to reduce thermal conductivity, specifically in comparison with GaN, to a considerable extent, e.g., by at least a factor of 2 or by at least a factor of 5 or by at least a factor of 10, see also document Liu, et al., Journal of Applied Physics, vol. 97, page 073710 from 2005. The disclosure content of this document is incorporated by reference.

The semiconductor stripe laser 1 is arranged for operation with relatively high current densities. As a result, heat is produced by means of an electrical resistance in particular on a boundary surface between the second electrical contact 43 and the second semiconductor region 13. By means of the thermal insulation apparatus 2, this heat is prevented from being discharged, so that a temperature of the second semiconductor region 13 is increased on the electrical second contact 43. As a result, a hole density on the second electrical contact 43 can likewise be increased by reason of the higher temperature, so that a voltage drop on the second electrical contact 43 can be reduced.

Since the insulation apparatus 2 is located between the active zone 12 and the second electrical contact 43, efficient cooling of the active zone 12 is possible at the same time in particular over the first electrical contact 41.

Optionally, as also in all of the other exemplified embodiments, the passivation layer 5 can have a thermal insulation layer 25 provided thereon which is to be assigned to the insulation apparatus 2. The thermal insulation layer 25 is formed preferably from an electrically conductive oxide or nitride and is configured in particular not in a monocrystalline manner but rather in a polycrystalline or amorphous manner. For example, the insulation layer 25 comprises, or consists of, one or a plurality of the materials stated hereinafter: indium-tin oxide, zinc oxide, fluorine-tin oxide, aluminum-zinc-oxide, antimony-zinc-oxide, titanium nitride, titanium-tungsten-nitride, titanium-oxynitride, an organic semiconductor material, an electrically conductive polymer and an electrically conductive resin, a synthetic resin having an electrically conductive, for instance metallic adjunct, a non-monocrystalline, inorganic semiconductor material, a poorly thermally conductive metal, such as nickel, titanium, platinum, bismuth, indium or antimony.

FIG. 2 illustrates a further exemplified embodiment of the semiconductor stripe laser 1. The thermal insulation apparatus 2 is formed from a layer stack of a plurality of the semiconductor layers 23a-23e. The layers 23a-23e preferably follow one another directly and are each based upon InAlGaN.

In the case of the exemplified embodiment as shown in FIG. 3, the insulation apparatus 2 is formed in the stripe waveguide 3 by virtue of the fact that a material composition or a material structure is changed in sub-areas 26 by means of implantation of ions, by the introduction of material by means of diffusion or for instance by means of electron radiation. As a result, thermal conductivity is reduced in sub-areas 26 which extend along the z-direction longitudinally of the stripe waveguide 3. A region between the sub-areas 26, along the y-direction, has, e.g., a width of at least 20% or 25% and/or of at the most 40% or 50% of a total width of the stripe waveguide 3.

In the case of the exemplified embodiment as shown in FIG. 4, the side of the passivation layer 5 facing away from the active zone 12 has the thermal insulation layer 25 provided thereon which serves to produce the insulation apparatus 2. Unlike the illustration, the insulation layer 25 preferably has a relatively large thickness, e.g., at least 200 nm or 500 nm or 1 μm. The materials stated in conjunction with FIG. 1 can be used as the materials.

As in all of the other exemplified embodiments, a height H of the stripe waveguide 3 is preferably at least 400 nm or 600 nm. Alternatively or in addition, the height H is, e.g., at the most 5 μm or 3 μm or 1.5 μm. A width B of the stripe waveguide 3 amounts, e.g., to at least 1 μm or 1.5 μm and alternatively or in addition preferably at the most to 100 μm or 50 μm or 15 μm. An angle β between the main surfaces of the passivation layer 5 at the base of the stripe waveguide 3 is, e.g., approximately 270°, for instance with a tolerance of at the most 20° or 10°.

In the case of the exemplified embodiment as shown in FIG. 5, a narrowed portion 21 is formed at the base of the stripe waveguide 3 and forms the insulation apparatus 2. An angle between the active zone 12 and the flanks of the stripe waveguide 3 exceeds 270° or 285°. The angle β amounts preferably at the most to 320° or 305°.

In the region of the narrowed portion 21, the thermal insulation layer 25 can have a greater thickness. However, in contrast to the illustration, it is also possible that a thickness of the insulation layer 25 is not enlarged in the region of the narrowed portion.

As shown in FIG. 6, the stripe waveguide 3 is configured in a T-shaped or I-shaped manner, in order to produce the insulation apparatus 2. In the region of the narrowed portion 21, lateral surfaces of the stripe waveguide 3 are oriented perpendicular or approximately perpendicular to the active zone 12. Alternatively, the lateral surfaces can have an angle of up to 40° to a perpendicular of the active zone 12. As in all of the other exemplified embodiments, a cross-section of the stripe waveguide 3 can remain the same or approximately the same along the z-direction.

A region directly on the second electrical contact 43 preferably has a thickness A of at the most 2 μm or 500 nm or 100 nm and/or of at least 5 nm or 10 nm or 20 nm. The narrowed portion 21 preferably has a thickness B of at least 1 nm or 10 nm or 100 nm and/or of at the most 2 μm or 500 nm. A width C of the narrowed portion 21 is e.g. at least 20 nm or 100 nm or 250 nm. The width C preferably amounts at the most to 90% or 80% or 70% or 60% of the total width of the stripe waveguide 3. A height E of the base of the stripe waveguide 3 is greater than or equal to 0 and is, e.g., at least 100 nm or 200 nm and/or at the most 500 nm or 200 nm. It is possible that a thickness of the second semiconductor region 13, in the y-direction next to the stripe waveguide 3, is at least 20 nm or 40 nm or 100 nm and/or at the most 600 nm or 400 nm or 300 nm. A length L of the stripe waveguide is preferably at least 300 nm or 600 nm and/or at the most 5 mm or 2 mm, see also FIG. 7B.

As shown in FIG. 7, the electrical contact structure has a bond pad 44b and a conductor track 44a. On the stripe waveguide 3, the conductor track 44a is structured to form a plurality of narrow fingers 44c. The individual fingers 44c have, e.g., a width of at least 0.5 μm and/or of at the most 20 μm. A spacing between adjacent fingers 44c is preferably at least 0.5 μm or 5 μm and/or at the most 52 μm. By virtue of the fact the fingers 44c are narrow, heat dissipation is reduced by the metallic contact structure and as a result the insulation apparatus 2 is produced. It is possible that the fingers 44c are restricted to the side of the stripe waveguide 3 facing away from the active zone 12, and to only one of the flanks of the stripe waveguide 3. In contrast thereto, the fingers 44c can also be provided on both flanks of the stripe waveguide 3, cf. FIG. 8.

In the case of the exemplified embodiment as shown in FIG. 8, the fingers 44c are covered by a further thermal insulation layer 24. Located between the fingers 44c and the second electrical contact 43 is the thermal insulation layer 25. The further thermal insulation layer 24 can be an electrically insulating or even an electrically conductive layer.

A main emission direction of the semiconductor stripe laser 1 lies in the y-z-plane and extends preferably in parallel with the z-direction. A main current direction for supplying current to the active zone 12 extends along the x-direction, as also in all of the other exemplified embodiments.

As shown in FIGS. 9 and 10, the contact structure 44a, 44b is not structured into fingers in regions but rather over the entire surface. Located between the contact structure 44a and the second contact 43 is the passivation layer 5. Formed in the passivation layer 5, are a plurality of openings 29, in which the contact structure 44a is in direct contact with the second contact 43.

The second electrical contact 43 preferably covers the entire side of the stripe waveguide 3, facing away from the active zone 12, or at least a large part of this side, e.g., at least 85% or 70%. Unlike the illustration, it is possible that the second contact 43 has a smaller width than the stripe waveguide 3, as is also possible in all of the other exemplified embodiments.

Unlike the illustration shown in FIG. 9B, it is not necessary that the openings 29 extend along the y-direction. The openings can also be restricted to regions, e.g., along the x-direction. The openings 29 preferably make up an area proportion of at the most 50% or 30%, in relation to an area of the second electrical contact 43 and as seen plan view. Likewise, the openings 29 can be produced as a dot pattern or as a cross pattern, see also FIG. 10B.

In the case of the exemplified embodiment as shown in FIG. 11, the thermal insulation apparatus 2 is produced exclusively by virtue of the fact that the contact structure is formed into the narrow fingers 44c in the region of the stripe waveguide 3.

The schematic view of FIG. 12 shows that the passivation layer 5 which at the same time forms the insulation apparatus 2 is a multilayered structure having the layers 25a-25g. A thickness of the passivation layer 5 then preferably amounts to at least 200 nm or 500 nm or 1 µm. A thickness of the individual layers is preferably at least 0.1 nm or 1 nm and/or at the most 10 nm or 20 nm or 100 nm. The multilayered structure preferably has as many boundary surfaces as possible and is formed, e.g., by means of alternating layers of silicon dioxide and silicon nitride, of aluminum oxide and silicon oxide, of aluminum oxide and zirconium oxide, of silicon oxide and zirconium oxide, of silicon nitride and zirconium oxide, of titanium oxide and silicon oxide or of hafnium oxide and zirconium oxide. Furthermore, the layer stack can have a combination of layers consisting of oxides or nitrides or oxynitrides of Al, Ce, Ga, Hf, In, Mg, Nb, Rh, Sb, Si, Zn, Ta, Ti, Sn or Zr.

As shown in FIG. 13, the conductor tracks 44a of the contact apparatus are formed as layer stacks, so that thermal conductivity of the conductor track 44a is reduced and the thermal insulation apparatus 2 is thus formed. A total thickness of the conductor track 44a is, e.g., at least 0.1 nm or 50 nm or 100 nm and/or at the most 1 µm or 5 µm or 20 µm. The individual layers of the layer stack preferably each have a thickness of at least 0.1 nm or 1 nm and/or at the most 20 nm or 100 nm or 500 nm. Preferably, the conductor track 44a is restricted to a flank of the stripe waveguide 3.

For example, the layer stack is formed by a combination of different metals, such as titanium and platinum, or by a combination of layers of a metal and electrically conductive non-metals or organic or inorganic semiconductors, e.g., consisting of titanium and indium-tin-oxide, by aluminum and titanium-tungsten-nitride, by zinc oxide and titanium and gold and titanium and zinc oxide. The layers of said materials can follow one another in alternating fashion.

As shown in FIG. 14, a comparatively poorly thermally conductive, electrically conductive layer or layer stack is provided between the contact apparatus 44 and the second electrical contact 43. The layer stack can be formed from the materials, as explained in conjunction with FIG. 13. A bond pad metallization, for instance consisting of titanium and gold, of titanium, platinum and gold or of chromium, platinum and gold can be provided on this layer stack 25.

In the case of the exemplified embodiment as shown in FIG. 15, the second electrical contact 43 is formed by means of a metal layer having a low thermal conductivity, e.g., consisting of platinum, palladium, nickel or rhodium. It is likewise possible that the second electrical contact 43 is formed by means of a layer of an electrically conductive oxide or nitride, such as indium-tin-oxide or zinc oxide. The second electrical contact 43 can also be formed by means of a layer stack. Unlike the illustration in FIG. 15, electricity can also be supplied in a similar manner to the exemplified embodiments as shown in FIG. 9 to 11, 13 or 14.

In a particularly preferred manner, several of the exemplified embodiments are combined together where technically feasible. In particular, the exemplified embodiments as shown in FIGS. 1 and 15 or as shown in FIGS. 1 and 9 or as shown in FIGS. 11 and 13 or as shown in FIGS. 1, 11 and 15 or as shown in FIGS. 9 and 15 are combined together.

FIGS. 16 to 18 show arrangements of a semiconductor stripe laser 1, which is described in this case, on a support 7. The support 7 is, for instance, a printed circuit board and/or a heat sink.

The stripe waveguide 3 faces away from the support 7 as shown in FIG. 16 and faces towards the support 7 as shown in FIGS. 17 and 18. In the case of the arrangement as shown in FIG. 16, which is preferred, a temperature on the second electrical contact 43 during operation is greater than in the active zone, not illustrated, based upon a normal use of the semiconductor laser 1. FIG. 16 also illustrates a bond wire 6.

As shown in FIG. 18, the electrical contact structure 44x, 44y is divided into two. In a first part 44x between the support 7 and the web waveguide 3 and on flanks of the web waveguide 3 close to the support 7, the contact structure 44x has a solder with a multiplicity of cavities. As a result, thermal conductivity of the contact structure 44x can be reduced. For example, the contact structure 44x has a thermal conductivity of at the most 50% or 25% of the thermal conductivity of the contact structure 44y which is soldered homogeneously and is substantially free of cavities. Such cavities are also referred to as bubbles or blowholes.

The cavities in the contact structure 44x preferably have a size of at least 0.1 µm and/or at the most 50% or 90% of a width of the stripe waveguide 3. At least 25% or 40% and/or at the most 75% or 50% of the contact structure 44x extends along the flanks. Furthermore, cooling of the web waveguide 3 in a lateral direction is possible via the contact structure 44y. The contact structure 44y is, e.g., at least 3-times or 5-times the width of the web waveguide 3.

In the case of the exemplified embodiment of the semiconductor stripe laser 1 as shown in FIG. 19, the insulation apparatus 2 is formed by means of a gap. The gap is evacuated or filled with gas, for instance with air. The gap can be located directly on the passivation 5 or can extend spaced apart from the passivation 5. A thickness of the gap amounts preferably at least to 1 nm or 10 nm and/or at the most to 200 nm or 100 nm. An angle of the gap, relative to the x-direction, is in particular between 0° and 15° inclusive or between 3° and 10° inclusive. The gap extends to at least 1% or 20% or 50% and/or to at the most 99% or 90% of a thickness of the contact structure 44, along the x-direction.

As is also the case in all of the other exemplified embodiments, the thickness of the contact structure 44 can exceed the height of the web waveguide 3, in the x-direction. In contrast thereto, the thickness of the contact structure 44 can be less than the height of the web waveguide 3. In the exemplified embodiments, it is likewise possible in each case that the passivation layer 5 extends onto a side of the second contact 43 facing away from the active zone 12. In the case of one embodiment of the contact structure 44 for instance as shown in FIG. 9, it is also possible that the gap on different sides of the stripe waveguide 3 is also formed differently and not symmetrically.

The invention described in this case is not limited by the description using the exemplified embodiments. Rather, the invention includes any new feature and any combination of features included in particular in any combination of features in the claims, even if this feature or this combination of features itself is not explicitly stated in the claims or exemplified embodiments.

What is claimed is:

1. A semiconductor stripe laser comprising:
   a first semiconductor region of a first conductivity type;
   a second semiconductor region of a second conductivity type that is different than the first conductivity type;
   an active zone configured to generate laser radiation, the active zone located between the first semiconductor region and the second semiconductor region;
   a stripe waveguide formed in the second semiconductor region, arranged to guide waves in a one-dimensional manner, and arranged for a current density of at least 0.5 kA/cm$^2$;
   a first electrical contact on the first semiconductor region;
   a second electrical contact located between the second semiconductor region and an electrical contact structure for external electrical contacting of the semiconductor stripe laser;
   an electrical passivation layer provided in certain places on the stripe waveguide; and
   a thermal insulation apparatus located between the second electrical contact and the active zone, wherein the thermal insulation apparatus is realized by a narrow portion in the stripe waveguide so that a temperature on the second electrical contact is increased during operation, wherein a width of the stripe waveguide in the narrowed portion amounts at most to 80 percent of a total width of the stripe waveguide, wherein a top face of the stripe waveguide is broader than the narrowed portion when seen in a sectional view, and wherein the stripe waveguide forms an I-shape when seen in the sectional view.

2. The semiconductor stripe laser according to claim 1, wherein a thermal insulation layer is applied in a region of the narrowed portion.

3. The semiconductor stripe laser according to claim 2, wherein the thermal insulation layer is formed from an electrically conductive oxide or nitride and is configured in a polycrystalline or amorphous manner.

4. The semiconductor stripe laser according to claim 3, wherein the thermal insulation layer comprises a material selected from the group consisting of indium-tin oxide, zinc oxide, fluorine-tin oxide, aluminum-zinc-oxide, antimony-zinc-oxide, titanium nitride, titanium-tungsten-nitride, and titanium-oxynitride and combinations thereof.

5. The semiconductor stripe laser according to claim 2, wherein the thermal insulation layer is formed from an electrically conductive polymer, an electrically conductive resin, a synthetic resin having an electrically conductive metallic adjunct, or a poorly thermally conductive metal selected from the group consisting of nickel, titanium, platinum, bismuth, indium or antimony.

6. The semiconductor stripe laser according to claim 2, wherein the thermal insulation layer has a constant thickness in the region of the narrowed portion.

7. The semiconductor stripe laser according to claim 2, wherein the thermal insulation layer has an enlarged thickness in the region of the narrowed portion so that the stripe waveguide together with the thermal insulation layer has a rectangular shape when seen in a cross-sectional view.

8. The semiconductor stripe laser according to claim 2,
   wherein the thermal insulation layer is formed by a layer stack, and
   wherein layers of the layer stack are each formed from an oxide or nitride.

9. The semiconductor stripe laser according to claim 2, wherein the thermal insulation layer completely extends between second electrical contact and the electrical contact structure for external electrical contacting of the semiconductor stripe laser with the second electrical contact, the second electrical contact being formed from a metal or a metal alloy.

10. The semiconductor stripe laser according to claim 1,
    wherein the narrow portion is located between the active zone and the second electrical contact and formed by material being removed from the second semiconductor region, and
    wherein the narrowed portion extends longitudinally of a main emission direction along the stripe waveguide.

11. The semiconductor stripe laser according to claim 1,
    wherein, in a region of the narrowed portion, lateral surfaces of the stripe waveguide are oriented perpendicular to the active zone, the lateral surfaces being connected by further surfaces with remaining surfaces of the stripe waveguide outside the narrowed portion,
    wherein the further surfaces run parallel with the active zone, and wherein a cross-section of the stripe waveguide remains constant along a z-direction.

12. The semiconductor stripe laser according to claim 1, wherein a region directly on the second electrical contact and directly atop the narrowed portion has a thickness between 20 nm and 2 μm,
    wherein the narrowed portion has a thickness between 10 nm and of 500 nm,
    wherein a width of the narrowed portion is at least 100 nm and at most 60% of the total width of the stripe waveguide,
    wherein a height of a base of the stripe waveguide below the narrowed portion is between 100 nm and 500 nm,
    wherein a thickness of the second semiconductor region is between 40 nm and 400 nm, and wherein a length of the stripe waveguide is between 600 nm and 2 mm.

13. The semiconductor stripe laser according to claim 1, wherein the first semiconductor region, the second semiconductor region and the active zone are based on $Al_n In_{1-n-m} Ga_m N$, where $0 \leq n \leq 1$, $0 \leq m \leq 1$ and $n+m \leq 1$.

* * * * *